(12) United States Patent
Hsieh et al.

(10) Patent No.: US 6,861,179 B1
(45) Date of Patent: Mar. 1, 2005

(54) CHARGE EFFECT AND ELECTROSTATIC DAMAGE PREVENTION METHOD ON PHOTO-MASK

(75) Inventors: Ren-Guey Hsieh, Pingtung (TW); Chang-Cheng Hung, Jubei (TW); Jaw-Jung Shin, Hsin Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 29 days.

(21) Appl. No.: 10/187,675

(22) Filed: Jul. 2, 2002

(51) Int. Cl.[7] .............................................. G03F 9/00
(52) U.S. Cl. ........................................ 430/5; 430/30
(58) Field of Search .................................. 430/5, 30

(56) References Cited

U.S. PATENT DOCUMENTS

| | | | |
|---|---|---|---|
| 5,989,754 A | * 11/1999 | Chen et al. ................. 430/5 |
| 6,140,021 A | 10/2000 | Nakasuji et al. ............ 430/296 |
| 6,153,340 A | 11/2000 | Nakasuji ..................... 430/5 |
| 6,165,693 A | 12/2000 | Lin et al. .................... 430/311 |
| 6,265,121 B1 | 7/2001 | Lin ............................ 430/30 |

* cited by examiner

*Primary Examiner*—Mark F. Huff
*Assistant Examiner*—Saleha Mohamedulla
(74) *Attorney, Agent, or Firm*—Thomas, Kayden, Horstemeyer & Risley

(57) ABSTRACT

Secondary mask pattern elements are used to interconnect isolated sub-patterns of a mask pattern. The interconnection of the isolated sub-patterns prevents different electrostatic charge accumulation on the various isolated sub-patterns. This prevents mask damage due to electrostatic discharge, problems with mask inspection, and problems with mask repair due to different electrostatic charge accumulation on various isolated sub-patterns. The mask is used to transfer the mask pattern to a layer of photosensitive material. The width of the secondary sub-pattern elements are sufficiently small relative to the wavelength of the light used to transfer the mask pattern to the photosensitive material that the secondary sub-pattern elements are not transferred to the photosensitive material.

28 Claims, 2 Drawing Sheets

CHARGE EFFECT AND ELECTROSTATIC DAMAGE PREVENTION METHOD ON PHOTO-MASK

BACKGROUND OF THE INVENTION (1) Field of the Invention

This invention relates to a photo-mask and method of forming a photo-mask which avoids mask damage, mask defect repair, and mask pattern inspection problems due to electrostatic charge accumulation.

(2) Description of the Related Art

U.S. Pat. No. 6,153,340 to Nakasuji describes methods and reticles for performing charged particle beam microlithography in which degradations in transfer accuracy arising from the space-charge effect and/or resist heating are reduced.

U.S. Pat. No. 6,140,021 to Nakasuki et al. describes a charged particle beam transfer method which minimizes the adverse effect of distortion or blur that arises from the space charge effect due to non-uniform pattern density.

U.S. Pat. No. 6,165,593 to Lin et al. describes a method of designing an assist feature which is incorporated with off-axis illumination to increase the process window for deep submicron lithography.

U.S. Pat. No. 6,265,121 B1 to Lin et al. describes a method of optical proximity correction.

SUMMARY OF THE INVENTION

Photo-masks are critical elements in the process of fabricating semiconductor integrated circuit wafers. The role of the photo-mask is to transfer patterns which are formed in the mask to a layer of photosensitive material formed on an integrated circuit wafer. Frequently these patterns comprise a number of sub-patterns which are isolated from one another. Typically the mask patterns are formed in a patterned layer of opaque mask material formed on a mask substrate. Usually the mask material is an electrical conductor, such as chrome. and the mask substrate is an electrical insulator, such as quartz. Different electrostatic charge levels can accumulate on different isolated sub-patterns.

The different electrostatic charge levels on different isolated sub-patterns can cause a number of serious problems for the defect repair, pattern inspection, and use of the masks. Mask measurements using scanning electron microscope, SEM, techniques will be distorted by electrostatic charge build up causing erroneous mask measurements. Different electrostatic charge levels can cause electrostatic discharge between isolated sub-patterns causing defects such as pattern bridging on the completed photo-mask. Different electrostatic charge levels can cause problems during mask repair using methods such as focus ion beam.

It is a principle objective of this invention to provide a method of forming a mask which avoids the problems of different electrostatic charge levels in different areas of the mask.

It is another principle objective of this invention to provide a mask which avoids the problems of different electrostatic charge levels in different areas of the mask.

These objectives are achieved by using secondary mask pattern elements to interconnect isolated mask elements. The mask pattern comprises a number of primary sub-patterns wherein none of the primary sub-patterns communicates with any other primary sub-pattern. One or more secondary pattern elements are then formed wherein each of the primary sub-patterns is connected to every other primary sub-pattern by means of the secondary pattern elements.

The interconnection of the primary sub-patterns by the secondary pattern elements prevents different charge accumulation on any one sub-pattern. The width of the secondary sub-pattern elements is sufficiently small relative to the wavelength of the light used to transfer the primary sup-patterns to a layer of photosensitive material that the secondary sub-pattern elements are not transferred to the layer of photosensitive material.

DESCRIPTION OF THE PREFERRED EMBODIMENTS

Figure 1:
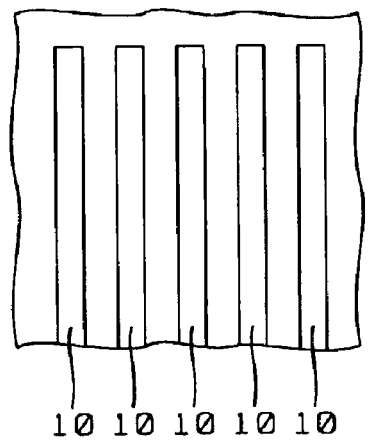
FIG. 1 shows a top view of a mask pattern having isolated primary sub-pattern elements.

Refer now to FIGS. 1–11 of the Drawings for a description of the preferred embodiments of the method and mask of this invention. FIG. 1 shows a top view of a segment of a pattern which is to be transferred to a layer of photosensitive material, such as photoresist, formed on an integrated circuit wafer. The pattern has a number of primary sub-patterns which are isolated from every other primary sub-pattern. In this example the sub-patterns are lines 10 so that the pattern is a number of lines 10 which are isolated from each other.

Figure 2:
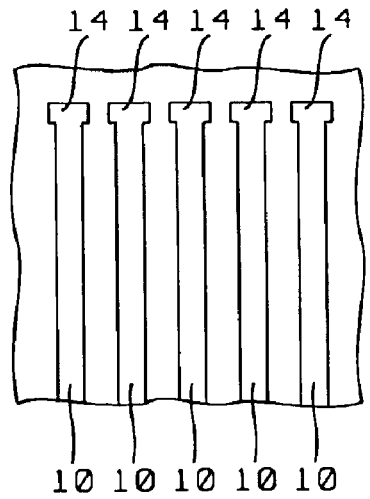
FIG. 2 shows a top view of the mask pattern of FIG. 1 having optical proximity correction added to the primary sub-pattern elements.

As shown in FIG. 2, optical correction is then applied to the pattern. In this example the optical correction comprises a rectangle 14 at the end of each line 10 which widens the line at the line end to prevent line shortening when the lines are transferred to a layer of photosensitive material. If the mask were formed with the isolated lines 10 and the optical proximity correction rectangles 14 shown in FIG. 2 on an electrically insulating mask substrate different electrostatic charge could build up or accumulate on the isolated lines and cause mask damage due to electrostatic discharge between adjacent lines. This different charge accumulation also can cause difficulties in inspecting the completed mask using methods such as a scanning electron microscope, SEM. This different charge accumulation can also cause problems with mask repair using tools such as a Focus Ion Beam mask repair tool.

Figure 3:
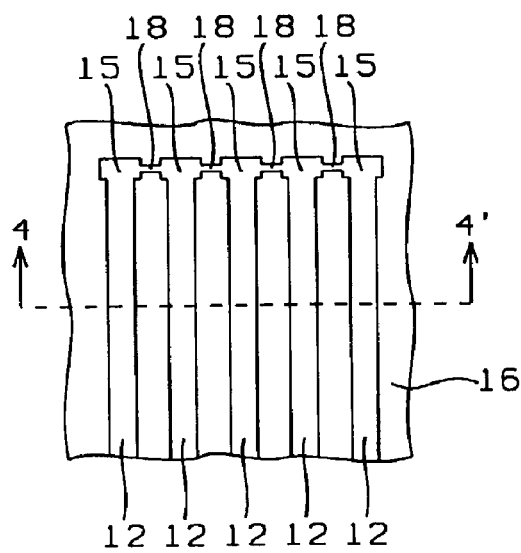
FIG. 3 shows a mask segment having the primary sub-pattern elements with optical proximity correction of FIG. 2 and secondary sub-pattern elements to avoid different electrostatic charge build up on individual sub-pattern elements.
Figure 4:
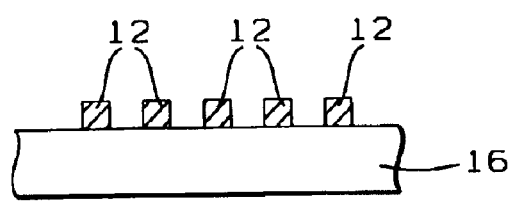
FIG. 4 shows a cross section view of the mask segment of FIG. 3.

FIG. 3 shows a mask substrate 16 having isolated lines 12 formed of mask material to represent the isolated line pattern shown in FIGS. 1 and 2. FIG. 3 shows rectangles 15 formed of the mask material to represent the optical proximity correction rectangles shown in FIGS. 1 and 2. Typically the mask substrate is transparent and an electrical insulator, such as quartz, and the mask material is opaque and a conductor, such as chrome. The key part of this invention is shown in FIG. 3, and comprises a series of narrow lines 18 formed of mask material which interconnect the isolated lines. These narrow lines 18 form the secondary pattern elements used to avoid different electrostatic charge accumulation on different isolated lines. Typically the mask material is opaque and an electrical conductor such as chrome. The width of the narrow lines 18 is sufficiently small so that the lines are not transferred to a layer of photosensitive material when the primary pattern of isolated lines is transferred to the layer of photosensitive material. FIG. 4 shows a cross section of the mask segment of FIG. 3 taken along line 4–4' of FIG. 3.

Figure 5:
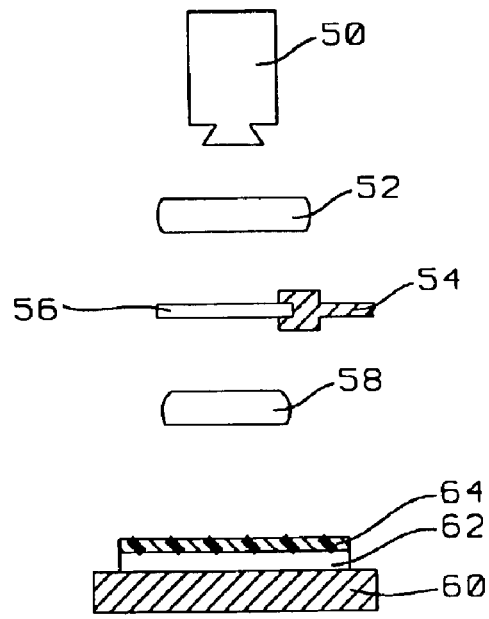
FIG. 5 shows a schematic view of a projection optical lithography system.

FIG. 5 shows a schematic view of an example of a projection lithography system used to transfer patterns to a layer of photosensitive material 64 formed on an integrated circuit wafer 62. A mask 56 with the pattern to be transferred is held in a mask holder 54 and the wafer 62 is held on a wafer holder 60. A condensing lens 52 and an objective lens 58 are used to focus the light from the light source 50 to transfer the pattern in the mask 56 to the layer of photosensitive material 64. Typically four times reduction projection systems are used.

The secondary pattern elements, reference number 18 in FIG. 3, have a width such that the width of the image of the secondary pattern elements mask projected on the layer of photosensitive material 64 is less than about 0.5 times the wavelength of the light from the light source 50 used to project the pattern image on the layer of photosensitive material. Pattern widths this small will not be transferred to the layer of photosensitive material.

Figure 6:
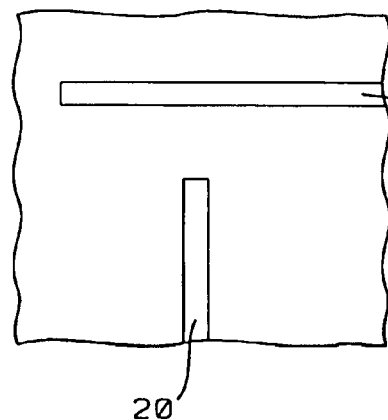
FIG. 6 shows a top view of another mask pattern having isolated primary sub-pattern elements.
Figure 7:
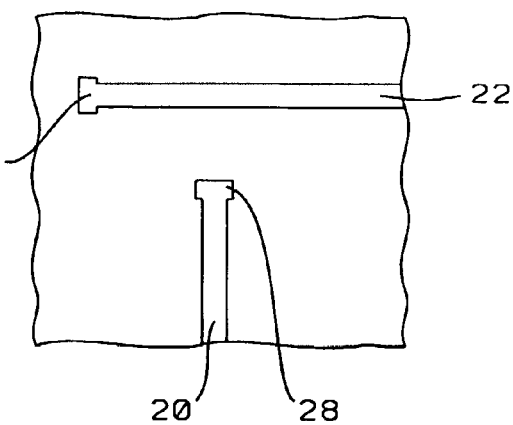
FIG. 7 shows a top view of the mask pattern of FIG. 6 having optical proximity correction added to the primary sub-pattern elements.
Figure 8:
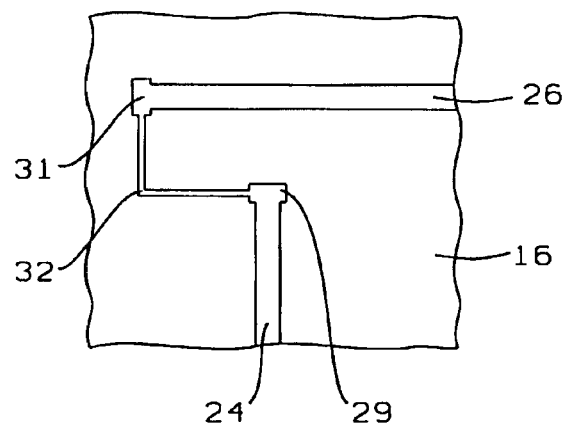
FIG. 8 shows a mask segment having the primary sub-pattern elements with optical proximity correction of FIG. 7 and secondary sub-pattern elements to avoid different electrostatic charge build up on individual sub-pattern elements.

FIGS. 6–8 show another embodiment of a method of forming a mask and a mask of this invention. FIG. 6 shows isolated pattern elements which are isolated line segments of a vertical line 20 at right angles to a horizontal line 22. In this example the one end of the vertical line 20 is close to one end of the horizontal line 22. FIG. 7 shows the pattern of FIG. 6 with optical proximity correction comprising a rectangle 28 at the end of the vertical line 20 and a rectangle 30 at the end of the horizontal line 22.

FIG. 8 shows a mask substrate 16 having an isolated vertical line 24 and horizontal line 26 formed of mask material to represent the vertical and horizontal line pattern shown in FIGS. 6 and 7. FIG. 8 shows a rectangle 29 at the end of the vertical line 24 and a rectangle 31 at the end of the horizontal line 26 formed of the mask material to represent the optical proximity correction rectangles shown in FIGS. 6 and 7. Typically the mask substrate is transparent and an electrical insulator, such as quartz, and the mask material is opaque and a conductor, such as chrome. The key part of this invention is shown in FIG. 8, and comprises a narrow line 32 formed of mask material which interconnects the vertical line and horizontal line. This narrow line 32 forms the secondary pattern element used to avoid different electrostatic charge accumulation on different isolated lines. Typically the mask material is opaque and an electrical conductor such as chrome. The width of the narrow line 32 is sufficiently small so that the narrow line 32 is not transferred to a layer of photosensitive material when the primary pattern of the vertical and horizontal lines are transferred to the layer of photosensitive material.

The secondary pattern element, reference number 32 in FIG. 8, has a width such that the width of the image of the secondary pattern element projected on the layer of photosensitive material 64 is less than about 0.5 times the wavelength of the light from the light source 50 used to project the pattern image on the layer of photosensitive material, see FIG. 5. Pattern widths this small will not be transferred to the layer of photosensitive material.

Figure 9:
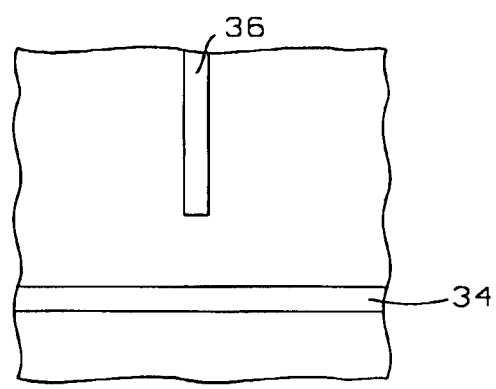
FIG. 9 shows a top view of another mask pattern having isolated primary sub-pattern elements.
Figure 10:
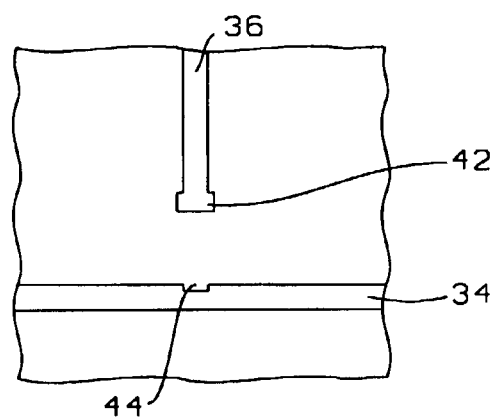
FIG. 10 shows a top view of the mask pattern of FIG. 9 having optical proximity correction added to the primary sub-pattern elements.
Figure 11:
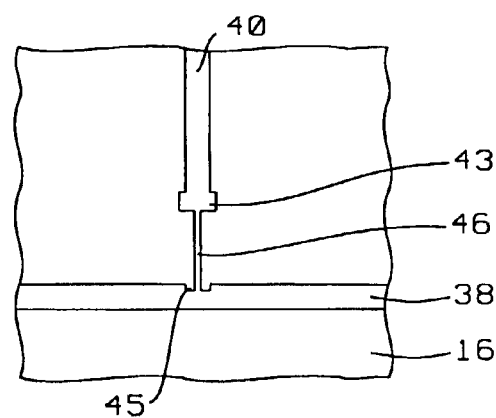
FIG. 11 shows a mask segment having the primary sub-pattern elements with optical proximity correction of FIG. 10 and secondary sub-pattern elements to avoid different electrostatic charge build up on individual sub-pattern elements.

FIGS. 9–11 show another embodiment of a method of forming a mask and a mask of this invention. FIG. 9 shows isolated pattern elements which are isolated line segments of a vertical line 36 at right angles to a horizontal line 34. In this example the one end of the vertical line 36 is not close to either end of the horizontal line 34. FIG. 10 shows the pattern of FIG. 9 with optical proximity correction comprising a rectangle 42 at the end of the vertical line 36 and a reduction 44 in the horizontal line 34 near the end of the vertical line 36.

FIG. 11 shows a mask substrate 16 having an isolated vertical line 40 and horizontal line 38 formed of mask material to represent the vertical and horizontal line pattern shown in FIGS. 9 and 10. FIG. 10 shows a rectangle 43 at the end of the vertical line 40 and a narrowing 45 of the horizontal line 38 formed of the mask material to represent the optical proximity correction shown in FIGS. 9 and 10. Typically the mask substrate 16 is transparent and an electrical insulator, such as quartz, and the mask material is opaque and a conductor, such as chrome. The key part of this invention is shown in FIG. 11, and comprises a narrow line 46 formed of mask material which interconnects the vertical line and horizontal line. This narrow line 46 forms the secondary pattern element used to avoid different electrostatic charge accumulation on the isolated lines. Typically the mask material is opaque and an electrical conductor such as chrome. The width of the narrow line 46 is sufficiently small so that the narrow line 46 is not transferred to a layer of photosensitive material when the primary pattern of the vertical and horizontal lines are transferred to the layer of photosensitive material.

The secondary pattern element, reference number 46 in FIG. 11, has a width such that the width of the image of the secondary pattern element projected on the layer of photosensitive material 64 is less than about 0.5 times the wavelength of the light from the light source 50 used to project the pattern image on the layer of photosensitive material, see FIG. 5. Pattern widths this small will not be transferred to the layer of photosensitive material.

While the invention has been particularly shown and described with reference to the preferred embodiments thereof, it will be understood by those skilled in the art that various changes in form and details may be made without departing from the spirit and scope of the invention.

What is claimed is:

1. A method of forming a mask, comprising:
   providing a mask substrate;
   forming a layer of mask material on said substrate; and
   forming a mask pattern in said layer of mask material comprising:
      a number of primary sub-patterns having at least one optical proximity correction plane figure at an end of each of said primary sub-patterns; and one or more secondary pattern elements, wherein each of said primary sub-patterns is connected to said optical proximity correction plane figure of every other said primary sub-pattern by means of said secondary pattern elements;

wherein said optical proximity correction plane figure is located at an end of each said primary sub-pattern to prevent pattern distorting when said primary sub-patterns are transferred to a layer of photosensitive material.

2. The method of claim 1 wherein said mask substrate is transparent.

3. The method of claim 1 wherein said mask material is opaque.

4. The method of claim 1 wherein said mask is a photomask for transferring said primary sub-patterns to a layer of photosensitive material.

5. The method of claim 4 wherein said photosensitive material is photoresist.

6. The method of claim 1 wherein said mask is a photomask for transferring said primary sub-patterns to a layer of photosensitive material, each of said secondary pattern elements has a width, and said secondary pattern elements will not be transferred to said layer of photosensitive material when said primary sub-patterns are transferred to said layer of photosensitive material.

7. The method of claim 6 wherein said photosensitive material is photoresist.

8. The method of claim 1 wherein said mask substrate is an electrical insulator.

9. The method of claim 1 wherein said mask substrate is quartz.

10. The method of claim 1 wherein said mask material is an electrical conductor.

11. The method of claim 1 wherein said mask material is chrome.

12. The method of claim 1 wherein said secondary pattern elements are line pattern elements having a width.

13. The method of claim 1 wherein said mask is a photomask for transferring said primary sub-patterns to a layer of photosensitive material using a projection system and a beam of light, and the image of said secondary pattern elements on said layer of photosensitive material have a width of less than 0.5 times the wavelength of said light in said beam of light.

14. A mask, comprising:

a mask substrate;

a layer of mask material formed on said substrate;

a mask pattern comprising:

a number of primary sub-patterns having at least one optical proximity correction plane figure at an end of each of said primary sub-patterns; and one or more secondary pattern elements, wherein each of said primary sub-patterns is connected to the optical proximity correction plane figure of every other said primary sub-pattern by means of said secondary pattern elements;

wherein said optical proximity correction plane figure is located at an end of each said primary sub-pattern to prevent pattern distorting when said primary sub-patterns are transferred to a layer of photosensitive material.

15. The mask of claim 14, wherein said mask substrate is transparent.

16. The mask of claim 14 wherein said mask material is opaque.

17. The mask of claim 14 wherein said mask is a photomask for transferring said primary sub-patterns to a layer of photosensitive material.

18. The mask of claim 17 wherein said photosensitive material is photoresist.

19. The mask of claim 14 wherein said mask is a photomask for transferring said primary sub-patterns to a layer of photosensitive material, each of said secondary pattern elements has a width, and said secondary pattern elements will not be transferred to said layer of photosensitive material when said primary sub-patterns are transferred to said layer of photosensitive material.

20. The mask of claim 19 wherein said photosensitive material is photoresist.

21. The mask of claim 14 wherein said mask substrate is an electrical insulator.

22. The mask of claim 14 wherein said mask substrate is quartz.

23. The mask of claim 14 wherein said mask material is an electrical conductor.

24. The mask of claim 14 wherein said mask material is chrome.

25. The mask of claim 14 wherein said secondary pattern elements are line pattern elements having a width.

26. The mask of claim 14 wherein said mask is a photomask for transferring said primary sub-patterns to a layer of photosensitive material using a projection system and a beam of light, and the image of said secondary pattern elements on said layer of photosensitive material have a width of less than 0.5 times the wavelength of said light in said beam of light.

27. The method of claim 1 wherein said plane figure is a rectangle.

28. The mask of claim 14 wherein said plane figure is a rectangle.

* * * * *